US008217724B2

(12) United States Patent
Briggs et al.

(10) Patent No.: US 8,217,724 B2

(45) Date of Patent: Jul. 10, 2012

(54) ATOMIC CLOCK

(75) Inventors: George Andrew Davidson Briggs, Oxford (GB); Arzhang Ardavan, Oxford (GB)

(73) Assignee: Isis Innovation Limited (GB)

( * ) Notice: Subject to any disclaimer, the term of this patent is extended or adjusted under 35 U.S.C. 154(b) by 95 days.

(21) Appl. No.: 12/665,828

(22) PCT Filed: Jun. 27, 2008

(86) PCT No.: PCT/GB2008/002229

§ 371 (c)(1),
(2), (4) Date: May 13, 2010

(87) PCT Pub. No.: WO2009/004317

PCT Pub. Date: Jan. 8, 2009

(65) Prior Publication Data

US 2010/0259334 A1 Oct. 14, 2010

(30) Foreign Application Priority Data

Jun. 29, 2007 (GB) .................................. 0712696.4

(51) Int. Cl.
*H03L 7/26* (2006.01)

(52) U.S. Cl. ............ 331/3; 331/94.1; 368/10; 324/300; 324/322

(58) Field of Classification Search ................. 331/94.1, 331/3; 324/300, 322; 368/10
See application file for complete search history.

(56) References Cited

U.S. PATENT DOCUMENTS

| | | | |
|---|---|---|---|
| 6,867,588 | B1 | 3/2005 | Hannah |
| 7,142,066 | B1 | 11/2006 | Hannah et al. |
| 7,173,421 | B2 | 2/2007 | Hannah |
| 2006/0022761 | A1 | 2/2006 | Abeles et al. |

FOREIGN PATENT DOCUMENTS

| | | |
|---|---|---|
| GB | 1152685 | 5/1969 |

OTHER PUBLICATIONS

Morley, G., et al., Efficient Dynamic Nuclear Polarization at High Magnetic Fields, arXiv:quant-ph/0611276v1, Nov. 28, 2006.

Brown, R., et al., Electron spin coherence in metallofullerenes: Y, Sc and La@C82, Feb. 8, 2010, pp. 1-5; (arXiv:1002.1282v1 [cond-mat. mtrl-sci] Feb. 5, 2010).

Knappe, S., MEMS Atomic Clocks, Comprehensive Microsystems, vol. 3, 2007, pp. 571-612.

(Continued)

*Primary Examiner* — Arnold Kinkead

(74) *Attorney, Agent, or Firm* — Quarles & Brady, LLP

(57) ABSTRACT

An atomic clock comprises endohedral fullerene systems which provide the standard frequency oscillations. A magnet device applies a magnetic field to the endohedral fullerenes. The applied magnetic field is adjustable. An excitation device both excites each endohedral fullerene system to cause it to undergo transitions which generate the time-keeping oscillations, and also probes the systems such that the oscillations can be measured and the device controlled. A detection device senses the response of the systems induced by the excitation device. The output of the detection device is fed to a controller. The controller produces the atomic clock output, which is the clock signal or frequency standard, and also controls the magnet device and the excitation device. The controller controls the magnetic field applied by the magnet device such that the energy difference of the time-keeping transition is insensitive to variations in magnetic field, thereby stabilizing the frequency of the oscillations and avoiding the effects of changes in external magnetic field.

19 Claims, 2 Drawing Sheets

OTHER PUBLICATIONS

Knappe, S., et al., A microfabricated atomic clock, Applied Physics Letters, vol. 85, No. 9, Aug. 30, 2004, pp. 1460-1462.

Morley, G., et al. Efficient Dynamic Nuclear Polarization at High Magnetic Fields; quant-ph/0611276; (Nov. 2006).

Morton, J., et al., High Fidelity Single Qubit Operations using Pulsed EPR, Phys. Rev. Lett. 95, 200501, Feb. 1, 2008, pp. 1-4, (arXIV:quant-ph/0502119v3, Oct. 10, 2005).

Morton, J., et al., Electron spin relaxation of N@C60 in CS2, J. Chem. Phys. 124, 104508, Feb. 2, 2008, pp. 1-6, (arXiv:cond-mat/0510610v2 [cond-mat.mtrl-sci] Jan. 5, 2006).

Morton, J., et al., Bang-bang control of fullerene qubits using ultra-fast phase gates, Nature Physics 2, 40-43 Feb. 1, 2008, pp. 1-5, (arXiv:quant-ph/0601008v2 Jan. 30, 2006).

Morton, J., et al., Environmental effects on electron spin relaxation in N@C60, Nov. 13, 2006, pp. 1-6, (arXiv:quant-ph/0611108v2 Nov. 12, 2006).

Nagel, A., et al., Influence of excited-state hyperfine structure on ground-state coherence, Physical Review A., vol. 61, 1999, pp. 012504-1-012504-4.

Tyryshkin, A., et al., Davies ENDOR revisited: Enhanced sensitivity and nuclear spin relaxation, Mar. 13, 2006, pp. 1-7, (arXiv:physics/0603078v1 Mar. 10, 2006).

PCT International Search Report, PCT/GB2008/002229, Oct. 10, 2008.

British Search Report, GB0712696.4, Oct. 23, 2007.

ATOMIC CLOCK

CROSS-REFERENCE TO RELATED APPLICATIONS

This application claims priority to PCT International Application No. PCT/GB2008/002229 filed on Jun. 27, 2008, which claims priority to Great Britain Application No. 0721696.4 filed on Jun. 29, 2007, incorporated by reference herein.

FIELD OF THE INVENTION

The present invention relates to the field of time-keeping devices and in particular to the field of devices known as atomic clocks.

BACKGROUND OF THE IVNEVTION

Devices called atomic clocks have been known for several decades and are able to keep time with very high precision. Conventional atomic clocks use atoms in a gas phase that can undergo transitions that correspond in energy to electromagnetic radiation in the microwave part of the spectrum. In one example a tunable microwave cavity contains the gas and the cavity can be tuned such that the field in the cavity oscillates very stably at a frequency corresponding to the energy transition in question. The most precise clocks at present are based on atomic fountains of cold atoms such as caesium or rubidium. Recently there have been developments using oscillations at frequencies corresponding to the optical (visible) part of the electromagnetic spectrum.

The availability of very high stability frequency standards, and the time-keeping that they provide, is used in many fields, including the synchronization of communication networks and in positioning systems, such as the satellite-based global positioning system (GPS). Conventional atomic clocks are generally quite large, delicate and have significant power requirements while operating. Thus there are the problems of providing compact, reliable, portable, low power atomic clocks.

Some proposals have been made regarding using endohedral fullerenes in a solid state atomic clock, see for Example U.S. Pat. No. 7,142,066. However, there are still problems regarding reducing environmental influence on the time-keeping, especially in portable devices, and also problems with achieving practical measurement and control of such systems.

The present invention aims to alleviate, at least partially, some or any of the above problems.

SUMMARY OF THE INVENTION

The present invention provides an apparatus comprising:

a condensed matter medium comprising at least one system that has at least a pair of states, said states comprising a first state and a second state with respective energy levels, said energy levels having an energy difference therebetween, wherein the energy difference varies as a function of applied magnetic field;

a magnet device arranged to apply an adjustable magnetic field to the medium;

an excitation device arranged to cause the at least one system to undergo transitions between said pair of states; and a detection device arranged to detect the response of the at least one system induced by the excitation device and to produce an output; and a controller for receiving the output of the detection device and arranged to control the magnet device such that the magnetic field applied to the medium has a value at which the rate of change of said energy difference with change in magnetic field is substantially zero, and to derive oscillations at a frequency determined by the energy difference between said pair of states between which the at least one system is caused to undergo transitions.

Embodiments of the invention will now be described, by way of non-limiting example, with reference to accompanying drawings, in which:—

DETAILED DESCRIPTION OF THE INVENTION

Figure 1:
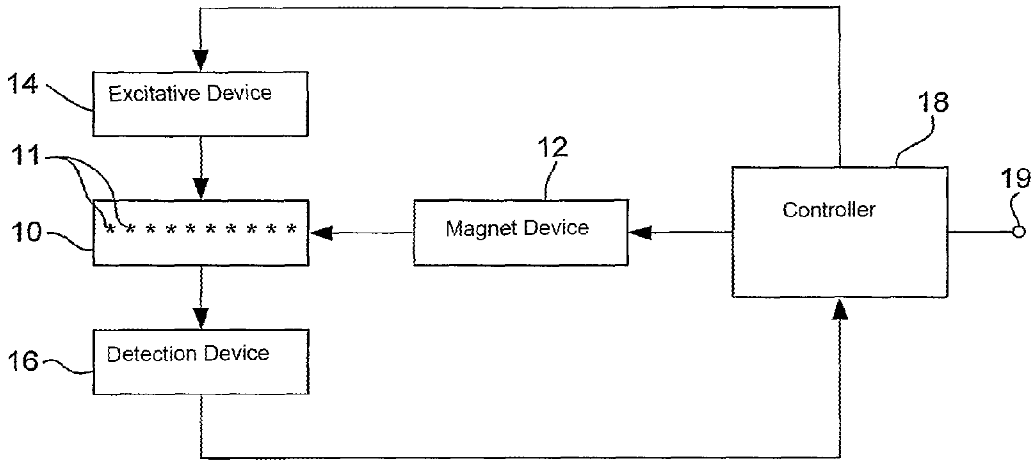
FIG. 1 is a schematic diagram of an atomic clock according to an embodiment of the invention.

FIG. 1 shows components of an atomic clock according to an embodiment of the invention. It should, of course, be noted that the term "atomic clock" is simply a convenient shorthand term for such devices. Firstly, they need not necessarily be "clocks". The heart of the device is an oscillator that can provide oscillations at a stable frequency. For this reasons, such devices may also be known as "frequency standards". By counting the oscillations of the standard frequency the clock function can be obtained because each oscillation represents a precise period of time. Secondly, the system undergoing the oscillations does not necessarily have to be "atomic" i.e. a single atom or atoms, but could also be ions, atomic clusters, molecular fragments, small molecules or other suitable species. The term "atomic clock" is used herein for convenience and is understood by the person skilled in the art to encompass all of the above terms and further alternatives.

Referring to FIG. 1, the core of the atomic clock is the medium 10 that comprises a system or systems 11 which provide the standard frequency oscillations. A magnet device 12 applies a magnetic field to the medium 10. The applied magnetic field is adjustable, as will be described in further detail below, however, the time-variation of the magnetic field applied by the magnet device 12 is essentially zero on the timescale of the time-keeping oscillations of the medium 10, in other words the magnet device 12 produces an essentially DC magnetic field.

An excitation device 14 both excites each system 11 of the medium 10 to cause it to undergo transitions which generate the time-keeping oscillations, and also probes the medium 10 such that the oscillations can be measured and the device controlled.

A detection device 16 is used to sense the response of the medium 10 induced by the excitation device 14. The output of the detection device 16 is fed to the controller 18. The controller 18 produces the output 19, which is the clock signal or frequency standard, and also controls the magnet device 12 and the excitation device 14.

Although the components in FIG. 1 are shown as separate items, they may, of course, be integrated; for example some or all of the components can be provided on a single, monolithic chip or integrated circuit, fabricated using techniques known from the fields of microlithography, nanotechnology, micro-electro-mechanical systems (MEMS) and/or nano-electro-mechanical systems (NEMS). Some or all of the components can also be provided with shielding from external influences, for example using a mumetal shield (not shown) to shield from magnetic fields and act as a Faraday cage to shield from electric fields.

Each of the components of FIG. 1 will now be described in more detail.

1. The Medium

In this preferred embodiment, the medium 10 is made of condensed matter, such as a solid, whether crystalline or non-crystalline, or such as a glass or other highly viscous material, or such as a liquid solution.

The medium 10 comprises a plurality of systems 11 capable of undergoing transitions between states which have an energy difference corresponding to a particular oscillation frequency. In the preferred embodiment, the systems are endohedral fullerenes.

The term "Fullerene" refers to a cage-like structure formed of carbon atoms and also known as carbon buckminster-fullerene or bucky-balls. The cage can be written as $C_n$, and the cage can be of various sizes; preferred embodiments include n=60, 70, 74, 80, 82, 84 and 90, but this is not an exhaustive list. $C_{60}$ is spherical, but the other fullerenes are elongated. The diameter of the fullerene is typically of the order of 1 nm. The term fullerene used herein also encompasses derivates of the basic buckminster-fullerene cages.

The term "Endohedral" means that a species is located within the fullerene cage. According to one embodiment, the endohedral species is a single atom of an element. In some endohedral fullerene systems the endohedral species donates one or more electrons to the cage. Known examples of atomic endohedral species include Er, Gd, P, La, Lu, N, Sc, Tm, Y, Ho or Pr, in a variety of different size fullerene cages. Preferred endohedral species include any Group V element (N, P, As, Sb or Bi). One preferred embodiment is endohedral nitrogen in $C_{60}$ (i.e. a single nitrogen atom inside a carbon bucky-ball, written as $N@C_{60}$). Diatomic endohedral species are also known, such as $Er_2$, $Hf_2$ or $La_2$. Other preferred embodiments include trimetallic nitride templated endohedral metallofullerenes (TNT EMFs) of the form $M_3N@C_n$ where M can be one or more metal elements (for example Sc or Er, or a combination), and n is preferably 80, but can take other values.

Preferably each system 11 is substantially identical. Endohedral fullerenes are attractive for use in an atomic clock because the endohedral species is shielded from the environment by the carbon cage. This means that both the electron and nuclear spin lifetime and coherence time of the endohedral species can be very long which is advantageous for stable frequency operation.

The endohedral fullerenes can be embedded in a solid matrix, either in a random manner or in a specific pattern. Furthermore, the endohedral fullerenes may be provided within other structures, such as carbon nanotubes. A solid substrate can be provided to support the endohedral fullerenes and the matrix or other structures. The endohedral fullerenes may be in the form of a crystalline solid or powder, or may be deposited on a surface in a continuous layer or using a supramolecular template, or they may be in solution. The concentration may be diluted to reduce spin-spin dephasing and thereby increase $T_{e2}$ (the electron spin coherence time). For example, a concentration of the order of 10E15 molecules of $N@C_{60}$ per milliliter (number density of molecules per $cm^3$) or lower, provided that it is reasonably uniformly dispersed, typically provides a spin decoherence time that is not limited by dipole-dipole interactions. Higher concentrations can be used, but, at significantly higher concentrations, the decoherence time deteriorates. The invention is not limited to a particular concentration or range of concentrations. [Throughout this specification the exponential notation xEy is used and is equivalent to $x\times10^y$]

Two preferred examples of endohedral fullerenes for use in this embodiment of the invention are $N@C_{60}$ and $P@C_{60}$. However $N@C_{60}$ is the presently preferred choice because it offers superior spin properties and thermal stability and does not have the significant safety hazards associated with the production of $P@C_{60}$, though $P@C_{60}$ is still one option. For $N@C_{60}$ the electron spin lifetime $T_{e1}$ can be as long as at least 0.1 ms at room temperature and the coherence time $T_{e2}$ approximately ⅔ $T_{e1}$. The nuclear spin lifetime $T_{n1}$ and coherence time $T_{n2}$ are also extremely long, for example at low temperature $T_{n1}$ can be almost arbitrarily long (several hours at 4.5 K).

Both N and P offer isotopes with nuclear spin I=½. This nuclear spin value is preferred because it has only two possible values along any given axis, such as an axis imposed by an applied magnetic field, namely +½ and −½; this eliminates some sources of decoherence such as nuclear quadrupole broadening and carbon hyperfine broadening. Therefore, in the preferred embodiment, either one or both of the N and/or C are isotopically purified forms, but this is not essential to the invention. The preferred endohedral fullerene molecule is therefore $^{15}N@^{12}C_{60}$.

2. Magnet Device

The magnet device 12 comprises one or more miniature coils for applying a magnetic field to the medium 10. The miniature coils can be, for example nanocoils or coiled nanowire and can be fabricated by techniques such as lithography. In one example a coil encircles the medium 10; in another example a single coil is provided on one surface of the medium 10 (this is especially suitable in examples in which the medium 10 is extremely thin); in another alternative a pair of coils are provided located at opposite surfaces of the medium 10 (i.e. like a pair of Helmholtz coils). The magnet may optionally have a soft ferromagnetic core, but for the low magnetic fields typically required this is not necessary.

3. Excitation and Detection Device

The excitation device 14 comprises a source of electric, magnetic or electro-magnetic oscillations at one or more frequencies. In the preferred embodiment, as discussed below, the frequencies correspond to the microwave part of the electro-magnetic spectrum, for example, tens of MHz. The microwave frequency source can be a simple analogue oscillator or a digital synthesiser. There is a wide choice of known cavity design. Features from the field of electron spin resonance (ESR) measurement may be employed, for example standard ESR spectrometers use cylindrical split ring resonators. Another alternative is a microwave stripline resonator; this could even incorporate more than one resonant frequency by having striplines angled with respect to each other.

The detection device 16 detects absorption at the excitation frequencies, either by directly measuring the change in field strength, or by detecting a change in the transparency of the medium. One example is a microwave sensor. Another example is circuitry to detect the impedance of the resonant cavity—change in impedance implying change in absorption. The detection device 16 may be separate from the excitation device 14, as shown in FIG. 1, or they may be integrated with each other.

In the preferred implementation of the invention, the detection is performed using spin resonance. There are two approaches to using spin resonance for this purpose: continuous wave spin resonance and pulsed spin resonance. Using continuous wave spin resonance, detection is achieved by observing an absorption of the applied microwaves; this can be detected as a change in impedance of the resonant cavity containing the spin species. Using pulsed spin resonance, detection is achieved by observing the induction from a precessing magnetic moment in the sample; this can be achieved by applying a sequence of pi and pi/2 pulses, and observing spin echo, as is done in the field of magnetic resonance imaging (MRI).

4. Controller

Figure 2:
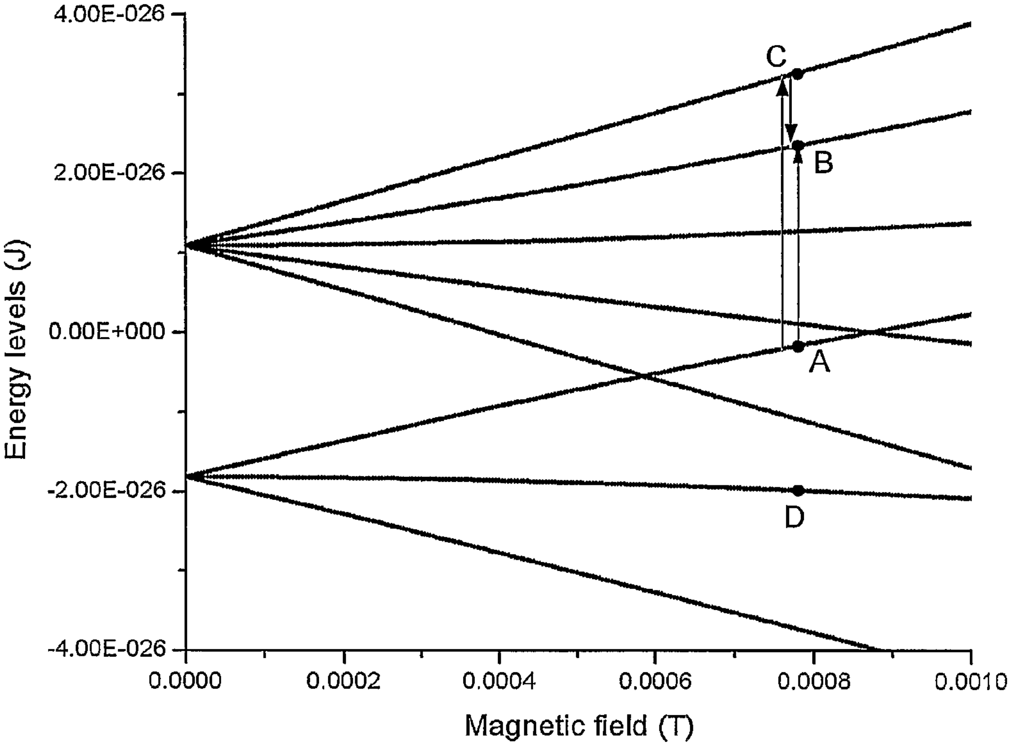
FIG. 2 is a plot of the energy levels of $^{15}N$ as a function of magnetic field.

To understand the controller 18 and the operation of the apparatus, first the energy levels of each system 11 in the medium 10 will be explained, with particular reference to $^{15}N$ as the endohedral species in an endohedral fullerene such as $N@C_{60}$. FIG. 2 shows the energy levels of $^{15}N$ as a function of magnetic field, calculated from the exact Hamiltonian (H):

$$H=g\mu_B BS_z+g_n\mu_n BI_z+AS\cdot I$$

where:

B is the magnetic field (T) in a direction defining a z-axis;

S is the total electron spin ($S_z$ being the component in the z-direction);

I is the total nuclear spin ($I_z$ being the component in the z-direction); and where the parameters used are as follows:

g is the electron gyromagnetic ratio, g=2.0023;

$\mu_B$ is the Bohr magneton, $\mu_B$=9.2847E-24 J $T^{-1}$;

$g_n$, is the nuclear gyromagnetic ratio, $g_n$=−0.566;

$\mu_n$ is the nuclear magneton, $\mu_n$=5.051E−27 J $T^{-1}$;

A is the hyperfine coupling constant, A=1.4508E−26 Hz

At zero magnetic field two discrete energy levels are apparent. These arise from the splitting of the ground state of the N atom into two states depending on whether the electronic magnetic dipole moment is parallel or antiparallel with the nuclear magnetic dipole. These two states are non-degenerate and so have different energy levels. A transition of the N atom between these two states arising from the magnetic dipole-dipole interaction is known as a hyperfine transition. When a magnetic field is applied, each of the energy levels splits into a plurality of levels as can be seen in FIG. 2. This is known as Zeeman splitting, and arises because the N atom can exist in a number of different states characterised by the quantized value of the magnetic dipole component in the direction of the applied magnetic field, and these states have different energy levels. An N atom in a fullerene cage is slightly perturbed compared with an isolated N atom in a vacuum. The values used to produce FIG. 2 are the ones that reproduce the $N@C_{60}$ ESR spectrum, so they already take into account the fact that the N atom is enclosed.

Figure 3:
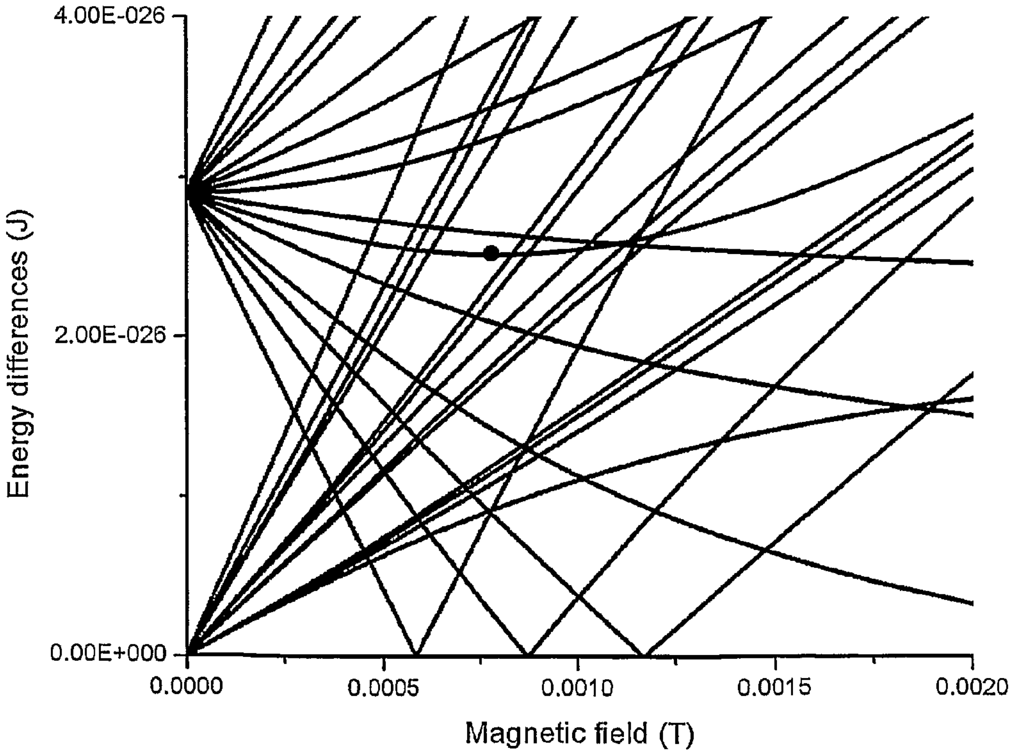
FIG. 3 is a plot of the differences between the energy levels of FIG. 2 as a function of magnetic field.

FIG. 3 shows the energy differences between each energy level in FIG. 2 and every other energy level in FIG. 2. The energy levels, of course, correspond with particular quantum-mechanical states of the atom (values of the nuclear spin and electronic magnetic moment components relevant to the magnetic field). Note that the horizontal axis in FIG. 3 extends to larger magnetic fields than FIG. 2.

In FIG. 3 at the point indicated by the circle, it can be seen that for a transition between two particular energy levels there is an energy difference that is to first order independent of magnetic field. In other words the rate of change of the energy difference with magnetic field is substantially zero, or small changes in magnetic field around that point do not change the energy difference of the transition. The magnetic field at this location is approximately 0.781 mT, and the energy difference in question corresponds to the transition between levels A and B indicated in FIG. 2. It should be pointed out that the states in the region of the transition AB are a hybridisation of the Zeeman and hyperfine levels, and it is because of this hybridisation that an anti-crossing is found at which the gradient of the energy difference (transition energy) with magnetic field is zero. However, in some contexts, this transition AB is still described as a hyperfine transition. It is observed in FIG. 2 that the plots of energy level are not linear with magnetic field; this is because of the hybridisation of the states as the magnetic field increases (S and I are vectors in the equation for the Hamiltonian). This non-linearity results in the non-linearity of the energy differences in FIG. 3.

The transition AB corresponds approximately to a frequency of 38 MHz (more precisely 37.9 MHz). The frequency f of an oscillation is related to the energy difference E by Planck's Constant h: E=hf. According to this embodiment of the invention, the apparatus is operated to use a transition whose frequency (i.e. energy difference) shows zero first-order dependence on magnetic field. This has the advantages of: (i) minimising errors due to fluctuations in external magnetic fields (these magnetic field fluctuations can arise from external electrical and electronic sources and from the earth's magnetic field as the orientation of a portable device containing the atomic clock changes), these external magnetic fields can even partially penetrate through shielding which is provided around the apparatus; and (ii) minimising decoherence arising from fluctuations in the electron spin.

Figure 4:
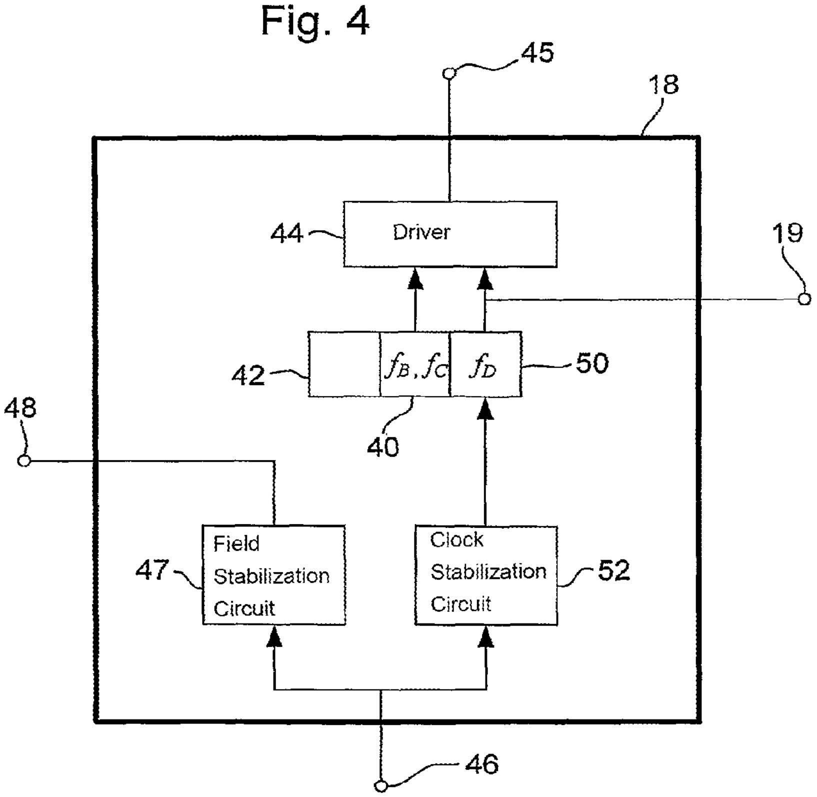
FIG. 4 is a schematic diagram of the controller of the atomic clock of FIG. 1.

The operation of the apparatus will now be described with reference to the controller 18 shown in FIG. 4, and in particular the following two aspects: (a) stabilisation of the magnetic field; and (b) obtaining the clock frequency.

(a) Magnetic Field Stabilisation

A first oscillator 40 produces an oscillating signal at a first frequency $f_B$. The frequency of oscillation is determined by, for example, a quartz crystal 42 or any other suitable frequency reference. The oscillating signal is provided to a driver 44 which produces an output 45 to drive the excitation device 14 of FIG. 1. In the present embodiment, the frequency of the first oscillator 40 is $f_B$=32.8 MHz. The frequency $f_B$ is chosen to correspond to a resonant absorption of the medium 10 that changes rapidly with magnetic field. For example, almost any of the transitions whose energy differences are shown in FIG. 3 would do; with preference being given for the stronger transitions, i.e. those for which the matrix element is sufficiently large to permit direct coupling. The detection device 16 detects the response of the medium 10 to the input frequency $f_B$, for example by detecting a change in impedance of a cavity of the excitation device 14, which is fed back to the controller 18 via terminal 46 and is received by the field stabilisation circuit 47. The field stabilisation circuit 47 measures the absorption at the first oscillation frequency and adjusts the output 48 that it provides to the magnet device 12. The output can be, for example, a current that is supplied to coils forming the magnet device 12. The field stabilisation circuit 47 adjusts the output 48 to control the magnetic field such that the absorption by the medium 10 at the first frequency $f_B$ is maximised. This locks the magnetic field to the desired value with a precision determined by the frequency $f_B$ provided by the first oscillator 40 and by the line width of the transition corresponding to the resonant absorption.

(b) Clock Frequency Determination

In the present embodiment, the transition AB, whose frequency is independent of magnetic field to first order, has a dipole strength between the two levels that is too low to be useful, so cannot be directly probed. However, each level A and B has a transition to a third level C, indicated by the arrows AC and CB in FIG. 2, and these transitions are four orders of magnitude stronger. Therefore the transition AB can be accessed by exciting transitions AC and CB. In this way the desired transition AB occurs indirectly via a third state C. In the present embodiment this is achieved by exciting the medium 10 with two frequencies $f_C+f_D$ and $f_C-f_D$, where $f_C+f_D$ corresponds with the transition AC, and $f_C-f_D$ corresponds with the transition CB. The transition AB corresponds with the frequency $2f_D$.

In practice one way to achieve this is by using the first oscillator 40 also to provide a carrier frequency $f_C$ (equal to $f_B$) and a second oscillator 50 to provide a second frequency $f_D$ for symmetrical sidebands of frequency $f_C \pm f_D$. Although the first and second oscillators 40, 50 are shown as separate units in FIG. 4, in practice the apparatus may comprise a centre frequency oscillator with a double sideband generator. A Robinson oscillator circuit or similar known circuit can be used as the basis for each frequency generator.

The carrier and sideband frequencies are supplied to the excitation device 14 by the driver 44. In the present embodiment the excitation device is a microwave generator and the central carrier frequency $f_C$ is 32.8 MHz and the symmetrical sidebands are of frequency 32.8±19 MHz, i.e. the frequency $f_D$ is 19 MHz.

In the preferred embodiment the excitation is provided in a continuous wave (CW) manner, which is simple to control, however, it is also envisaged that the excitation may be pulsed.

Alternative transitions using a different third energy level to access the transition AB can, of course, be used, for example using the energy level indicated D in FIG. 2 and exciting transitions AD and DB.

The detection device 16 detects the response of the medium 10 to the applied frequencies. When the frequency $f_D$ is selected such that the value $2f_D$ matches the transition AB, then at that resonance the medium 10 shows a minimum in absorption, i.e. in this resonant scheme the medium becomes approximately transparent to radiation at the relevant frequency. The clock stabilisation 52 circuit receives the output of the detection device 16 and uses feedback to adjust the frequency $f_D$ in order to achieve this resonance. The frequency $f_D$ is output at the terminal 19 and is, of course, the frequency standard that is the output of this "atomic clock".

The strength of the resonant absorption varies as $d_{AC}d_{CB}B_1B_2/(\Delta+\Gamma)$, where $d_{AC}$ and $d_{CB}$ are the matrix elements of those transitions, $B_1$ and $B_2$ are the microwave magnetic field magnitudes for those two transitions, $\Delta$ is the detuning and $\eta$ is the reciprocal lifetime. As long as the centre frequency $f_C$ is within approximately $\eta$ of the correct frequency, then the performance of the apparatus is not strongly sensitive to the error represented by $\Delta$. The clock stabilisation circuit 52, may, of course, optionally also use feedback to adjust $f_C$ to maximise the response of the medium 10, but the precision of the clock does not depend critically on $f_C$.

According to the present embodiment of the invention, because the apparatus is operated in a regime in which the transition AB (corresponding to a frequency $2f_D$) has no first order dependence on magnetic field, any drift in magnetic field (for example from external influences such as orientation of the device relative to the earth's magnetic field) or any imprecision in the control of the magnetic field applied to the medium, will affect the frequency $f_D$ only to second order. This means the frequency error will be less than one part in $10^{12}$ for an error of one part in $10^6$ in the reference frequency, such as provided by the quartz crystal 42 or similar. Therefore this atomic clock is six orders of magnitude more accurate than the reference oscillator, but can still be used for portable or small-scale applications. Because the error is quadratic with the magnetic field error, an improvement in precision of one order of magnitude in the reference frequency (e.g. of the quartz crystal) offers an improvement of two orders of magnitude in the clock frequency, up to the limit of the decoherence rate of the electron spin. Therefore, in applications where increased power consumption is less critical, performance can optionally be improved by, for example, controlling the temperature of the quartz crystal providing the reference frequency, such that the temperature is substantially constant.

In this embodiment of the invention, the frequency of the first oscillator 40 is used both in the control of the magnetic field (by probing a separate resonant absorption) and as the central (carrier) frequency of the double sideband signal for the clock frequency determination. This arrangement is convenient and requires fewer components, and is preferred for its simplicity. However, in an alternative embodiment, separate oscillator frequencies $f_B$, $f_C$ could be used for the two functions, which would give greater freedom for the choice of frequency of the resonant absorption used for the magnetic field stabilization. For example, in the above case, using $^{15}N@C_{60}$ and a working magnetic field of 0.78 mT, the transition from the lowest level to the next lowest level (in FIG. 2) corresponds to a frequency of 26.37 MHz which could be used for $f_B$ for magnetic field stabilisation, and is different from $f_C$. In both cases, either separate reference oscillators can be used for $f_B$ and $f_C$, or standard synthesiser circuitry can be used to derive different frequencies from a single reference oscillator.

In the scheme described above, the spin system 11 is effectively used to multiply the precision of the oscillation frequency of a reference oscillator, such as the quartz crystal oscillator 42. However, in a further modification of this embodiment of the invention, the crystal reference oscillator 42 can be dispensed with altogether. The frequency $f_B$ of the transition which is field dependent is approximately a rational multiple or fraction of the desired clock frequency $f_D$. A low precision oscillator is configured to generate an initial frequency in the vicinity of $f_B$, the resonant absorption of the medium at approximately the desired applied magnetic field. A feedback loop modifies the magnetic field so as to ensure that the two frequencies $f_B$ and $f_D$ have the desired ratio, thereby guaranteeing that the magnetic field is correct to give a value of $f_D$ with no first order dependence on magnetic field. Thus the system locks onto the high precision frequency of oscillation required for the frequency standard output of the atomic clock. In this way the quartz crystal or similar for the reference oscillator (which in some cases needs to be temperature stabilized) is unnecessary; a low-precision and therefore cheaper oscillator (such as a simple inductor-capacitor LC resonant circuit) can be used to provide the initial reference frequency.

In any of the above embodiments, the transitions are preferably selected such that the frequency of the resonant absorption $f_B$ used for magnetic field stabilisation is a rational multiple or fraction of the clock transition (AB) frequency, or more preferably a rational multiple or fraction of half the clock transition (AB) frequency. In the symmetric sideband scheme, the transition AB corresponds to a frequency 2 $f_D$, so half that frequency is $f_D$; thus, in one example, the frequencies are related as follows:

$$f_B = nf_D$$

where n is an integer; in a preferred example n=2. In this way, a reference oscillator need only be provided for one of the frequencies, and the other frequency can be derived simply by using a frequency multiplier or divider, or standard digital electronics.

The invention claimed is:

1. An apparatus comprising:

a condensed matter medium comprising at least one system that has at least a pair of states, said states comprising a first state and a second state with respective energy levels, said energy levels having an energy difference therebetween, wherein the energy difference varies as a function of applied magnetic field;

a magnet device arranged to apply an adjustable magnetic field to the medium;

an excitation device arranged to cause the at least one system to undergo transitions between said pair of states; and a detection device arranged to detect the response of the at least one system induced by the excitation device and to produce an output; and a controller for receiving the output of the detection device and arranged to control the magnet device such that the magnetic field applied to the medium has a value at which the rate of change of said energy difference with change in magnetic field is substantially zero, and to derive oscillations at a frequency determined by the energy difference between said pair of states between which the at least one system is caused to undergo transitions.

2. Apparatus according to claim 1, wherein the at least one system has a third state, and at least some transitions between said pair of states occur indirectly via the third state.

3. Apparatus according to claim 2, wherein the excitation device is arranged to cause the at least one system to undergo transitions between the first and third states and between the second and third states.

4. Apparatus according to claim 2, wherein the excitation device is arranged to induce oscillations at a frequency corresponding to the energy difference between the first and third states and induces oscillations at a frequency corresponding to the energy difference between the second and third states.

5. Apparatus according to claim 2, further comprising an oscillator arranged to produce a signal for driving the excitation device, wherein the signal has a central frequency $f_C$ and symmetrical sidebands at frequencies $f_C+f_D$ and $f_C-f_D$, wherein $f_C+f_D$ corresponds with a transition between the first and third states, $f_C-f_D$ corresponds with a transition between the second and third states, and the frequency $2f_D$ corresponds with a transition between the first and second states.

6. Apparatus according to claim 1, wherein the excitation device is capable of inducing oscillations at more than one frequency, and is arranged to induce oscillations at a further frequency corresponding to a transition between a further pair of states when under a particular magnetic field, said particular magnetic field being that at which the rate of change of said energy difference with change in magnetic field is substantially zero, and the controller is arranged to control the magnet device such that the frequency corresponding to the transition between said further pair of states is equal to the further frequency of the oscillations induced by the excitation device.

7. Apparatus according to claim 6, wherein the further frequency is a rational multiple or fraction of the frequency determined by the energy difference between said first and second states.

8. Apparatus according to claim 1, wherein the detection device is a spin resonance detection device.

9. Apparatus according to claim 1, wherein the at least one system comprises an endohedral fullerene.

10. Apparatus according to claim 9, wherein the endohedral species comprise one selected from the group consisting of: N, P, As, Sb, Bi, Er, Gd, La, Lu, Sc, Tm, Y, Ho, Pr, $Er_2$, $Hf_2$, $Sc_3$ and $La_2$, or comprises a trimetallic nitride of the form $M_3N$ where M is one of or a combination of any of the metallic elements in the preceding list.

11. Apparatus according to claim 10, wherein the endohedral species has a nuclear spin of ½.

12. Apparatus according to claim 10, wherein the endohedral species comprises $^{15}N$.

13. Apparatus according to claim 9, wherein the fullerene is selected from the group consisting of: $C_{60}$, $C_{70}$, $C_{74}$, $C_{80}$, $C_{82}$, $C_{84}$, $C_{90}$, preferably $C_{60}$.

14. Apparatus according to claim 9, wherein the fullerene comprises isotopically purified $^{12}C$.

15. Apparatus according to claim 1, wherein the at least one system comprises N@$C_{60}$ or P@$C_{60}$.

16. Apparatus according to claim 1, wherein said excitation device operates in a continuous wave manner or in a pulsed manner.

17. Apparatus according to claim 1, wherein said excitation device is a microwave generator.

18. Apparatus according to claim 1, wherein a transition between said pair of states is a magnetic dipole transition.

19. Apparatus according to claim 1, wherein said pair of states differ in energy level due to a magnetic dipole-dipole interaction between a nuclear magnetic dipole moment and electronic magnetic dipole moment.

* * * * *

UNITED STATES PATENT AND TRADEMARK OFFICE

CERTIFICATE OF CORRECTION

| | |
|---|---|
| PATENT NO. | : 8,217,724 B2 |
| APPLICATION NO. | : 12/665828 |
| DATED | : July 10, 2012 |
| INVENTOR(S) | : George Andrew Davidson Briggs et al. |

It is certified that error appears in the above-identified patent and that said Letters Patent is hereby corrected as shown below:

Column 1, line 18: “IVNEVTION” should read --INVENTION--

Signed and Sealed this
Twenty-first Day of August, 2012

David J. Kappos
*Director of the United States Patent and Trademark Office*